United States Patent [19]

Corpechot et al.

[11] Patent Number: 4,780,630
[45] Date of Patent: Oct. 25, 1988

[54] DOUBLE DIFFERENTIAL SUMMING AMPLIFIER WITH FOUR INDEPENDENT INPUTS

[75] Inventors: Myriam Corpechot, Etampes; Joël Montaron, Paris, both of France

[73] Assignee: Commissariat A L'Energie Atomique, Paris, France

[21] Appl. No.: 67,592

[22] Filed: Jun. 26, 1987

[30] Foreign Application Priority Data

Jun. 27, 1986 [FR] France ............................. 86 09376

[51] Int. Cl.$^4$ ............................................. H03F 3/16
[52] U.S. Cl. ..................................... 307/529; 330/69; 330/253
[58] Field of Search ............... 307/360, 362, 364, 490, 307/491, 529, 497; 330/252, 253, 261, 277, 69, 9

[56] References Cited

U.S. PATENT DOCUMENTS

| 3,956,643 | 5/1976 | Hite | 307/497 |
| 4,081,758 | 3/1978 | Steckler | 330/69 X |
| 4,460,874 | 7/1984 | Haque | 330/261 |

FOREIGN PATENT DOCUMENTS

| 0019279 | 11/1980 | European Pat. Off. |  |
| 0168198 | 1/1986 | European Pat. Off. |  |
| 3232442 | 3/1984 | Fed. Rep. of Germany |  |
| 0181711 | 10/1984 | Japan | 330/69 |

Primary Examiner—Eugene R. Laroche
Assistant Examiner—Steven J. Mottola
Attorney, Agent, or Firm—M. N. Meller

[57] ABSTRACT

A double differential summing amplifier circuit with four independent inputs, having two equipotential supply lines L1 and L2 raised respectively to potentials −V and +V; four MOS amplifier transistors M1, M2, M3 and M4, the gates of which constitute the inputs e1, e2, e3 and e4 of the circuit and which are respectively connected to sources supplying the voltages to be amplified of values Ve1, Ve2, V33 and Ve4, the drains D1, D2, D3 and D4 of these transistors being connected pairwise, namely D1 and D3 of transistors M1 and M3, on the one hand, for constituting the first output of the circuit on which is collected the amplified voltage Vs1, and D2 and D4 of transistors M2 and M4, on the other hand, for constituting the second output of the circuit on which is collected the amplified voltage Vs2; four load resistors M5, M6, M7 and M8 respectively connecting the drains D1, D2, D3 and D4 of transistors M1, M2, M3 and M4 to equipotential line L1; an MOS transistor M9 functioning as a current generator, whose drain D9 is connected to the common point of the four sources S1, S2, S3 and S4 of transistors M1, M2, M3 and M4, the source S9 of which is connected to equipotential line L2 and whose gate g9 is connected to a polarizing voltage source Upol3.

4 Claims, 2 Drawing Sheets

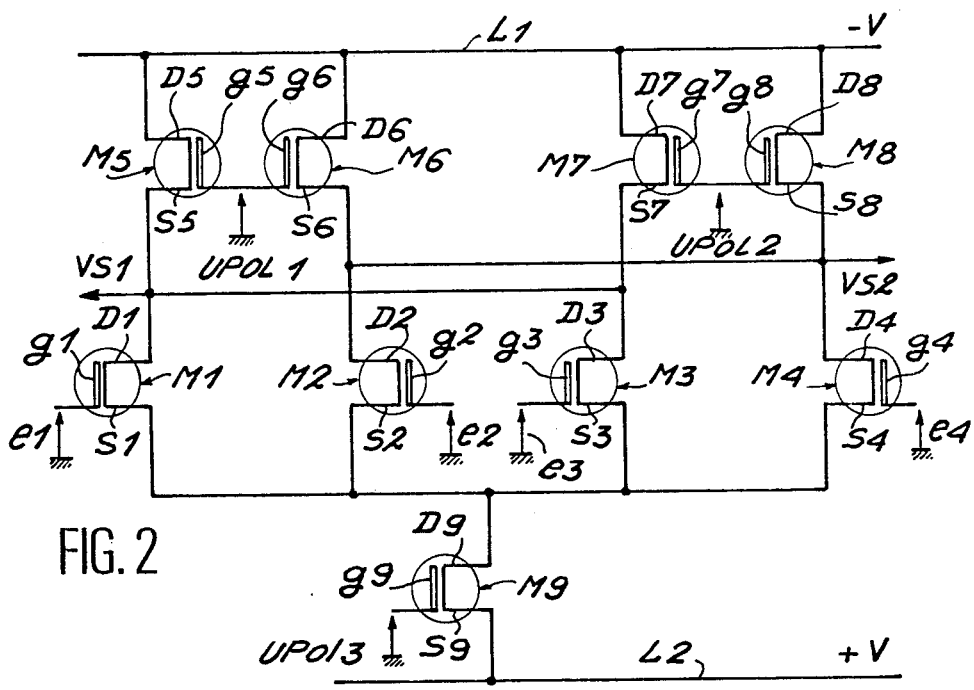
FIG. 2
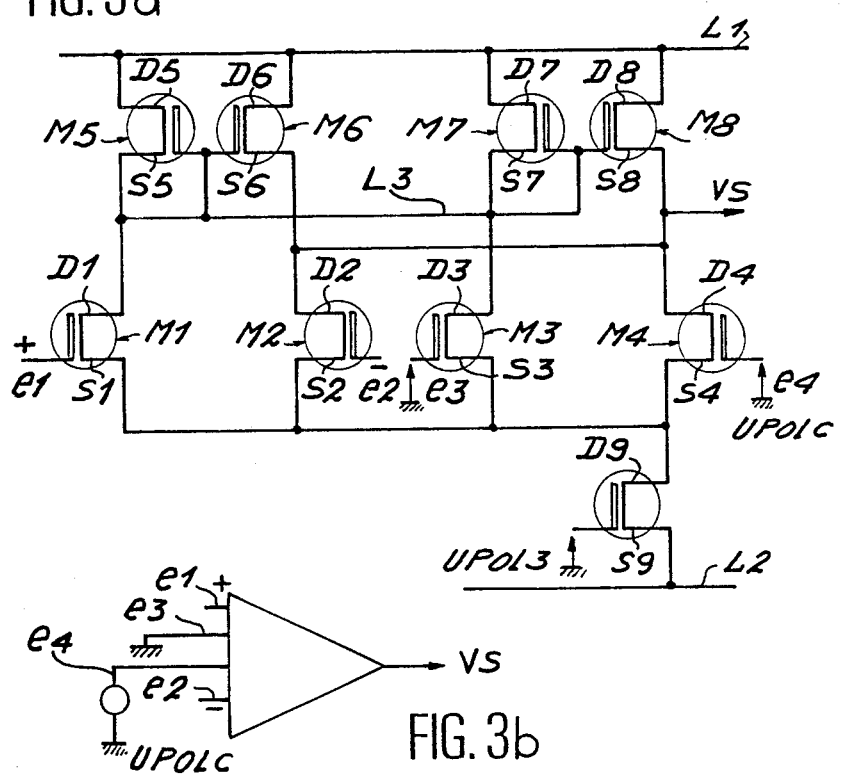
FIG. 3a
FIG. 3b

DOUBLE DIFFERENTIAL SUMMING AMPLIFIER WITH FOUR INDEPENDENT INPUTS

BACKGROUND OF THE INVENTION

The present invention relates to a double differential summing amplifier with four independent inputs.

In the electronic processing of analog signals, such as are encountered in operational amplifiers, comparators and sample and hold circuits, it is often necessary to effect linear combinations of sums and/or differences of given signals, optionally following amplification. The state of the art provides no apparatus meeting this requirement and the first objective of the circuit according to the invention is to meet this requirement.

Such a circuit has four amplifying and/or summing branches to which are applied four input voltages and the circuit supplies two output voltages, the difference of which constitutes the amplified voltage. A second objective of this circuit is to solve the problem of the known abnormalities of the transfer curve of a differential amplifier and its operating point, either by means of an external control or automatically.

It is well known that when use is made of MOS transistors in integrated circuits, it is not possible to carry out a precise check or control with respect to regulation of the operating points of each of the components considered in isolation.

In general terms, the response curve of a differential amplifier has the standard configuration shown in FIG. 1. On the ordinate is plotted the output voltage Vs as a function of the input voltage Ve on the abscissa. Conventionally, the amplification curve 1 does not pass through the origin of the coordinates, which means that for a zero input voltage, the output voltage is not equal to zero. This known shortcoming of differential amplifiers is obviated by providing an offset voltage, which is equal to segment OM in FIG. 1, which represents the voltage which has to be applied to the input of the amplifier to collect a zero voltage at the output.

In the prior art amplifiers, the operating points have hitherto been corrected by several more or less effective and precise methods, such as the adjustment of one of the input voltages with the aid of an external potentiometer or by the control of a resistor with the aid of a laser or, as in the case of the amplifier circuit forming the object of French patent No. 2 318 534 in the name of the present Applicant with the aid of a common mode feedback system, or through the use of a half-branch of the amplifier, etc. To these different corrections are added dynamic problems during operation.

SUMMARY OF THE INVENTION

The present invention relates to a differential amplifier circuit with four inputs, two of which can be used for modifying the operating point, either as wished by the user, or automatically, and the other two of which serve as a differential input for the amplification.

Thus, the present invention specifically relates to a double differential summing amplifier circuit with four independent inputs, comprising two equipotential supply lines L1 and L2 raised respectively to potentials $-V$ and $+V$; four MOS amplifier transistors M1, M2, M3 and M4, the gates of which constitute the inputs e1, e2, e3 and e4 of the circuit and which are respectively connected to sources supplying the voltages to be amplified of values Ve1, Ve2, Ve3 and Ve4, the drains D1, D2, D3 and D4 of said transistors being connected pairwise, namely D1 and D3 of transistors M1 and M3, on the one hand, for constituting the first output of the circuit on which is collected the amplified voltage Vs1, and D2 and D4 of transistors M2 and M4, on the other hand, for constituting the second output of the circuit on which is collected the amplified voltage Vs2; four load resistors M5, M6, M7 and M8 respectively connecting the drains D1, D2, D3 and D4 of transistors M1, M2, M3 and M4 to equipotential line L1; an MOS transistor M9 functioning as a current generator, whose drain D9 is connected to the common point of the four sources S1, S2, S3 and S4 of transistors M1, M2, M3 and M4, the source S9 of which is connected to equipotential line L2 and whose gate g9 is connected to a polarizing voltage source Upol3.

According to a particularly interesting variant of the present invention, the amplifier circuit uses as the load resistor four MOS transistors operating in the ohmic zone and the drains D5, D6, D7 and D8 of which are directly connected to line L1, the sources S5, S6, S7 and S8 of said transistors being directly connected to the drains D1, D2, D3 and D4 of transistors M1, M2, M3 and M4, the gates G5 and G6 of M5 and M6 being connected to a polarization source Upol1 and the gates G7 and G8 of M7 and M8 being connected to a polarization source Upol2, wherein polarizations Upol1 and Upol2 can be identical.

In a first embodiment of the invention, the compensation of the offset voltage of the amplifier circuit is brought about by an external control. In this embodiment, the polarizing voltages Upol1 and Upol2 are equal to one another and to the output voltage Vs1. The voltages Ve1 and Ve2 constitute the inputs respectively $>0$ and $<0$ of the amplifier, input e3 being raised to ground potential, voltage Ve4 being used as the external compensation control and output voltage Vs2 being used as the output voltage of the amplifier.

In a second embodiment of the invention, the compensation of the offset voltage is brought about automatically, the latter being raised dynamically to a minimum value with the aid of a combination of two amplifier circuits A1 and A'1 formed on the same integrated circuit chip and consequently operating under substantially identical conditions with regards to external influences (particularly e.g. radiation) to which they are exposed. In a construction of this type, the second amplifier A'1 functions as an "image" of the first and at all times supplies the correction value to be made on the first amplifier to minimize the variations of the operating point thereof, which is thus automatically stabilized.

In this embodiment, the first amplifier A1 is looped in unitary gain with its input e1 connected to output S1 and its three inputs e2, e3, e4 connected to ground. The second amplifier A'1 is the image of the first and its inputs e'1 and e'4 constitute the positive and negative inputs of the differential amplifier A and input e'2 is connected to ground.

BRIEF DESCRIPTION OF THE DRAWINGS

The invention is described in greater detail hereinafter relative to three non-limitative embodiments of the differential amplifier circuit according to the invention and with reference to the attached FIGS. 2 to 4, wherein;

FIG. 2 is a general diagram of the differential summing amplifier circuit according to the invention.

FIG. 3a shows a first application of the circuit of FIG. 2 in an embodiment where compensation is brought about by external control.

FIG. 3b is the equivalent diagram of the amplifier circuit of FIG. 3a.

DETAILED DESCRIPTION OF THE PREFERRED EMBODIMENTS

Figure 1:
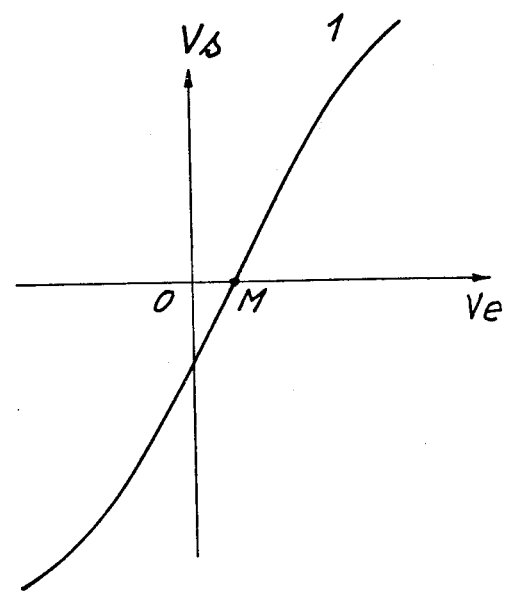
FIG. 1 is a response curve of a conventional differential amplifier.

FIG. 2 firstly shows the two equipotential lines L1 and L2 respectively connected to voltage sources or supplies −V and +V used as a supply for the amplifier circuit. The actual amplifying part has four MOS transistors M1, M2, M3 and M4, which are connected in the following way: their respective gates g1, g2, g3 and g4 constitute the four inputs e1, e2, e3 and e4 of the amplifier circuit. To these inputs are applied the voltages to be amplified, namely Ve1, Ve2, Ve3, and Ve4. Drains D1, D2, D3 and D4 of the four transistors M1, M2, M3 and M4 are in each case connected to the equipotential line L1 across load resistors M5, M6, M7 and M8. These resistors can be formed in different known ways. In the case of FIG. 2, they are realized in a simple manner with the aid of MOS transistors M5, M6, M7 and M8 operating in the ohmic zone. To this end, transistors M5, M6, M7 and M8 are respectively connected by their sources S5, S6, S7 and S8 to the drains D1, D2, D3 and D4 of transistors M1, M2, M3 and M4.

According to the invention, transistors M1 and M3, on the one hand, and M2 and M4 on the other hand have their drains D1 and D3, on the other hand and D2 and D4, on the other hand, connected pairwise to constitute the outputs Vs1 and Vs2 of the differential amplifier circuit.

Finally, a transistor M9 used as a current generator has its drain D9 connected at the common point to sources S1, S2, S3 and S4 of transistors M1, M2, M3 and M4 and its source S9 connected to equipotential line L2. This current generating transistor M9 has its gate g9 connected to a polarization source Upol3.

Two polarization sources Upol1 and Upol2, which can be identical, are respectively applied at the common points to gates g5 and g6 of transistors M5 and M6 and to g7 and g8 of transistors M7 and M8.

If G is called the amplification gain of each of the transistors M1, M2, M3 and M4, the following equations can be used for translating the ratios between the input and output voltages of the various aforementioned MOS transistors:

$$Vs1 = G(Ve1 + Ve3)$$

$$Vs2 = G(Ve2 + Ve4)$$

$$Vs1 - Vs2 = G(Ve1 + Ve3) - G(Ve2 + Ve4)$$

It can be seen that the differential amplifier circuit of FIG. 2 gives output voltages Vs1 and Vs2, the difference of which is a linear combination of the input voltages associated pairwise, respectively Ve1 and Ve3, on the one hand, and Ve2 and Ve4, on the other hand. It was this formulation which was the sought objective justifying the general interest of this circuit and in particular the possibility of using it with a manual or automatic regulation of its operating point, i.e. in particular its offset voltage, with the aid of an external polarization source, as will be gathered hereinafter with reference to FIGS. 3 and 4.

FIG. 3a shows an embodiment of the application of the amplifier circuit in which the offset voltage is compensated with the aid of a manual external control. This circuit has the same elements as those of FIG. 2 which carry the same references, with the exception of the following differences. The polarizing voltages Upol11 and Upol12 are in this case equal to one another and equal to the output voltage Vs1, as provided by conductor 13, which injects the voltage Vs1 of FIG. 2 at the common points of gates g5, g6, on the one hand, and gates g7, g8, on the other hand. The external manual correction control is effected across transistor M4, whose gate g4 serves as the input e4 to the polarizing correction voltage Upolc. Finally, output Vs2 is used in this circuit as the output Vs of the complete amplifier circuit.

FIG. 3b is the block diagram of the circuit of FIG. 3a diagrammatically showing the connection of the differential amplifier circuit having the four inputs e1, e2, e3 and e4, e1 and e2 of which constitute the positive and negative inputs of the amplifier. Input e3 is connected to ground and input e4 receives the control polarizing voltage Upolc from the amplifier operating point. Voltage Vs is the output voltage corresponding to output Vs2 of FIG. 2.

In this embodiment, at all times, as a result of the linearity of the aforementioned formulas expressing the voltage differences, it is possible by modifying the control polarizing voltage applied at input e4 to regulate the operating point and bring about the desired compensation of the instantaneous offset value of the amplifier.

Figure 4:
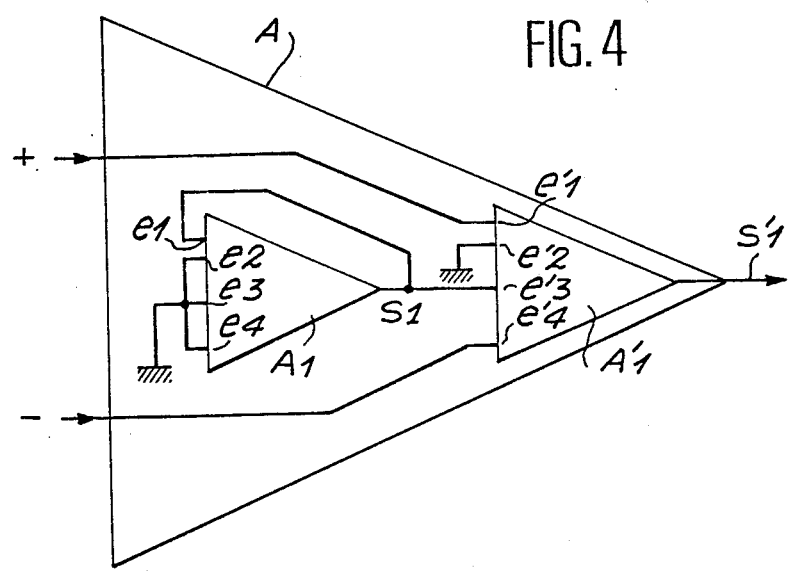
FIG. 4 shows an application of the differential amplifier circuit according to the invention in a version having two circuits A1 and A'1 permitting an automatic compensation of offset voltage variations.

The circuit of FIG. 4, which will now be described, relates to the application of the amplifier circuit of FIG. 3a to the production of a differential amplifier, whose offset voltage is dynamically minimized automatically. For this purpose, the circuit has, on the same integrated circuit chip and arranged in known manner in nested form so as to have one common axis of symmetry and consequently the same electrical characteristics, two identical amplifiers A1, A'1, the second of which is the image of the first, their respective connections being effected in the following way.

The differential amplifier A1 with four inputs according to the invention is connected looped on itself in unitary gain, i.e. input e1 is connected to the output S1 of said amplifier. The three other inputs e2, e3 and e4 are connected to ground. Output S1 of amplifier A1 directly supplies input e'3 of the amplifier A'1. Input e'2 of amplifier A'1 is grounded and the two extreme inputs e'1 and e'4 respectively constitute the positive and negative inputs of the overall amplifier A. Output S'1 of amplifier A'1 constitutes the output of amplifier A.

As the two amplifiers A1 and A'1 are identical and are located in space at the same location on the same chip, they have comparable operating points and the linearity of the different output voltages as a function of the input voltages is due to the fact that the image amplifier A'1 at all times automatically effects the optimum correction of the offset voltage of amplifier A1. Thus, in integrated circuit form on the same chip and in a very advantageous manner due to the identity of amplifiers A1 and A'1, an overall amplifier A1 is obtained, which is dynamically and automatically corrected with respect to faults of its offset voltage.

This correction of the offset voltage of amplifier A is effective because the two amplifiers A1 and A'1 are images of one another, no matter what the variations of their operating points over a period of time. The thus obtained compensation need not be regulated from the outside and evolves spontaneously in accordance with the behavior of the two amplifiers over a period of time.

What is claimed is:

1. A double differential summing amplifier circuit with four independent inputs e1, e2, e3, and e4, comprising two equipotential supply lines L1 and L2 raised respectively to potentials $-V$ and $+V$; four MOS amplifier transistors M1, M2, M3 and M4, each MOS amplifier transistor having a gate, a drain and a source, said gates constituting said inputs e1, e2, e3 and e4 of the circuit and being respectively connected to sources supplying voltages to be amplified of values Ve1, Ve2, Ve3, and Ve4, said drains D1, D2, D3 and D4 of said transistors being connected pairwise, namely D1 and D3 of transistors M1 and M3 being connected, on the one hand, for constituting a first output of the circuit on which is collected an amplified voltage Vs1, and D2 and D4 of transistors M2 and M4 being connected, on the other hand, for constituting a second output of the circuit on which is collected an amplified voltage Vs2; four load resistors M5, M6, M7 and M8 respectively connecting the drains D1, D2, D3 and D4 of transistors M1, M2, M3 and M4 to equipotential line L1; an MOS transistor M9 functioning as a current generator, a drain D9 of which is connected to a common point of sources S1, S2, S3 and S4 of transistors M1, M2, M3 and M4, a source S9 of which is connected to equipotential line L2 and a gate g9 of which is connected to a polarizing voltage source Upol3.

2. A double differential summing amplifier circuit according to claim 1, wherein the load resistors M5, M6, M7, M8 are constituted by MOS transistors operating in an ohmic zone, each MOS transistor having a gate, a drain and a source, the drains D5, D6, D7, D8 of said MOS transistors being directly connected to line L1, sources S5, S6, S7, S8 of said MOS transistors being directly connected to drains D1, D2, D3 and D4 of transistors M1, M2, M3 and M4, gates G5, G6 of MOS transistors M5, M6 being connected to a polarization source Upol1 and gates G7, G8 of MOS transistors M7, M8 being connected to a polarization source Upol2, whereby polarizations Upol1 and Upol2 can be identical.

3. A differential amplifier circuit according to claim 2 with an offset voltage compensated by external control, wherein polarizing voltages Upol1 and Upol2 are equal to one another and to the output voltage Vs1, inputs e1 and e2 constituting positive and negative inputs respectively of the amplifier, input e3 being connected to ground, voltage Ve4 being used as the external compensation control and output voltage Vs2 being used as the output voltage of the amplifier.

4. A differential amplifier circuit whose offset voltage is dynamically minimized automatically, comprising first and second double differential amplifier circuits according to claim 1, four respective inputs e1, e2, e3, e4 of said first double differential amplifier circuit and e'1, e'2, e'3, e'4 of said second double differential amplifier circuit being independent, said first double differential amplifier circuit being looped in unitary gain with its input e1 connected to its output S1 and its three inputs e2, e3, e4, connected to ground, said second double differential amplifier circuit, which is the image of said first double differential amplifier circuit, receiving on its input e'3 the output voltage S1 from said first double differential amplifier circuit, inputs e'1 and e'4 of said second double differential amplifier circuit constituting the positive and negative inputs of the differential amplifier, and input e'2 being connected to ground.

* * * * *